United States Patent [19]
Young

[11] Patent Number: 4,966,787
[45] Date of Patent: Oct. 30, 1990

[54] METHOD OF CREATING ISOLATED PLATES ON THE INSIDE SURFACE OF A METALLIZED SUBSTRATE

[75] Inventor: Lydia J. Young, Palto Alto, Calif.

[73] Assignee: The Perkin Elmer Corporation, Norwalk, Conn.

[21] Appl. No.: 367,919

[22] Filed: Jun. 19, 1989

[51] Int. Cl.$^5$ .......................... B05D 3/12; B05D 5/12
[52] U.S. Cl. ...................... 427/106; 427/10; 427/125; 427/277; 427/444
[58] Field of Search ................. 427/10, 106, 107, 123, 427/125, 124, 235, 277, 444

[56] References Cited
U.S. PATENT DOCUMENTS
4,390,789 6/1983 Smith et al. ........................ 250/492.2

Primary Examiner—Evan Lawrence
Attorney, Agent, or Firm—Thomas P. Murphy; Edwin T. Grimes

[57] ABSTRACT

A method for forming an electrostatic field deflector tube (50) for use in an electron beam machine (10) which comprises the use of a rigid boring bar (88) with a diamond scribe tip (90) and a rigid holder (92) for the metal coated tube. The scribe tip (90) is positioned within the bore of the tube and the boring bar (88) is stroked in a direction parallel to the tube axis while engagement with the inner coating to scribe very narrow lines (66) on the inner surface of the tube. These lines (66) are formed over a major portion of the length of the tube and of a width less than 0.001 in. After each scribing step, the tube (or the boring bar and scribe tip as the case may be) is incrementally rotated to form a number of separate electrically isolated areas. Dial position indicators with digital readouts (92) locate the scribe tip (90) within a few ten thousandths of an inch and optical and resiatance means are used to determine the integrity of each scribed line.

9 Claims, 2 Drawing Sheets

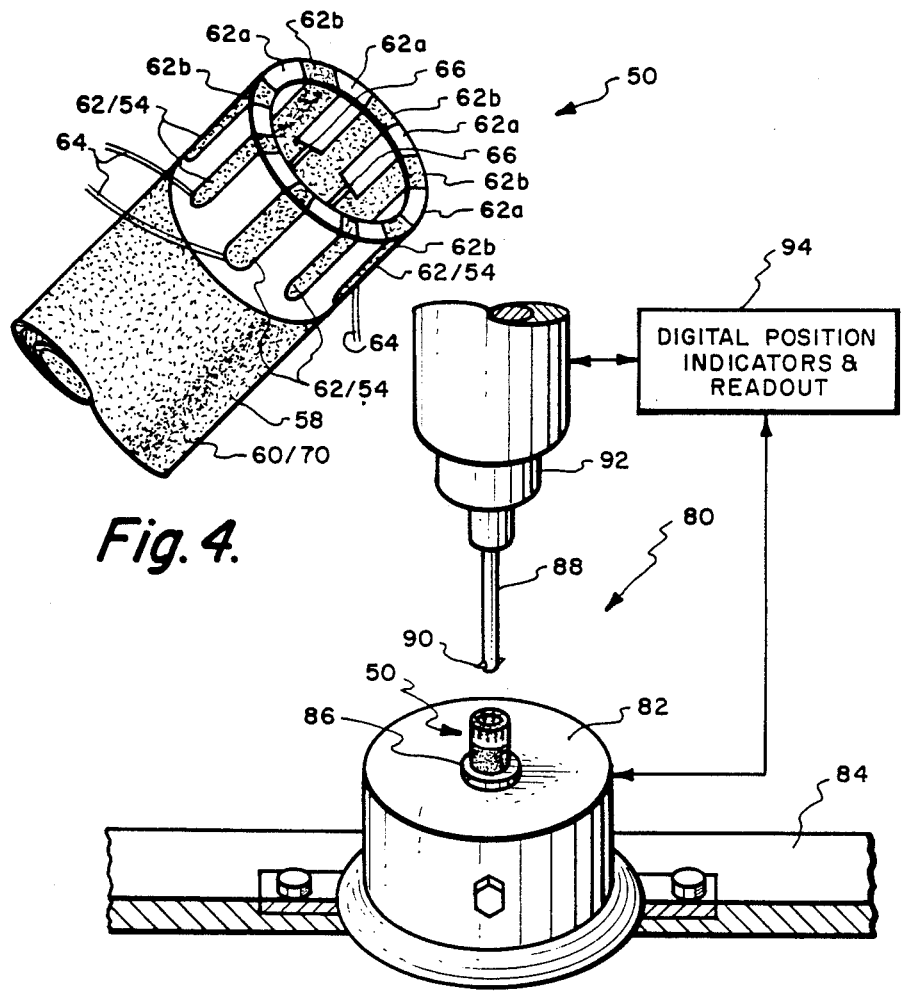
Fig. 4.
Fig. 5.
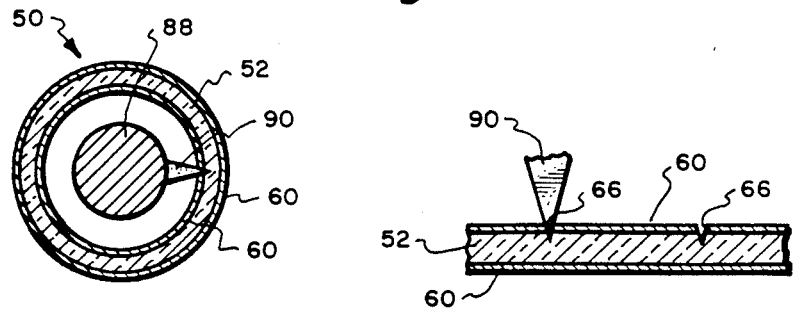
Fig. 6.   Fig. 7.

METHOD OF CREATING ISOLATED PLATES ON THE INSIDE SURFACE OF A METALLIZED SUBSTRATE

BACKGROUND OF THE INVENTION

This invention relates, in general, to a method of forming electrically isolated areas on a metallized substrate and is particularly directed to a method of making an electrostatic deflector for use in controlling an electron beam in an electron beam lithography machine.

In an electron beam lithography machine, there is a beam column with a centrally located electron beam which is controlled to perform a writing operation on a substrate, such as a wafer or mask, located below the beam column. In the beam column, the electron beam is within a central tube which has a section, called a minor field deflector, with electrostatic plates which deflect the beam $+/-32$ microns at a very high speed by electrostatics as part of the writing operation. In order to achieve this high speed, the electrostatic plates must have a very low capacitance and must be such that the electron beam is not adversely affected by exposed substrate. One such deflector is actually a glass tube approximately 6.3 inches long and about 0.6 inches ID and 0.75 inches OD. The tube is coated on the insides and the outsides with a thin film of gold approximately 10 to 20 microinches (0.25 to 0.50 microns) in thickness. The inside surface of this tube is divided into eight areas that are equally spaced, equal in area, and electrically isolated from one another to form electrostatic metal plates. In the beam column, each of these eight plates is electrically connected in pairs of opposite plates to a voltage source to create an electrostatic field to control the electron beam. Opposing plates have the same voltage value but of opposite polarity.

In order to achieve the high speed and provide very low capacitance, the deposited thin metal film on the inner surface of the substrate (glass) is divided into areas (plates) by scribing lines of a specific width and depth on the inner surface of the tube.

In a prior art method of forming these electrostatic plates, the preo-coated glass tube was mounted in a holder and a reciprocating boring bar with a diamond scribe tip was inserted into the inner bore of the tube and withdrawn along a major portion of the length of the tube, while in engagement with the coating, to scribe lines which separated the coating into separate areas. The scribe tip was held against the inner wall by the bias of a spring during the scribing step, and after each scribing step, the tube was rotated and the drawing step repeated to form the eight separate plates.

In practice, there were two ways in which the scribe tip was spring loaded. In one setup the scribe tip was mounted on a short arm pivotally connected to the boring bar. The pivotal arm was spring biased toward the tube. It was found that the pivot point was too loose and the scribe tip wobbled from side to side. In another setup the scribe tip was mounted on a leaf spring which was mounted on the boring bar. This method also failed. The main problem was that the lines were not cut all the way through the metal coating; thus, separate plates were not created. These setups also did not allow re-scribing since the scribe lines were not exactly on top of one another and thus would create two scribed lines which was unacceptable. Thus the two prior art methods were essentially a one time operation and could not be redone. This caused low yield and high scrap which increased manufacturing cost.

Other methods of creating isolated plates have been suggested, for example, etching the lines between the plates but the separation by these methods is too wide leaving large areas of the substrate which would cause a charging of the substrate by the electron beam which would in turn disturb the beam. It has also been suggested that the substrate be covered with a charge drain coating to correct the effect of these wide lines but this is an additional and costly step. The present invention avoids this extra coating by minimizing the area of exposure of the substrate to the electron beam.

It is thus an object of this invention to provide an improved method of creating isolated electrostatic plates on a field deflector so that the plates are electrically isolated from one another with a spacing that will not create a disturbance of the electron beam being controlled within the deflector.

SUMMARY OF THE INVENTION

The method of this invention for forming an electrostatic deflector for use in an electron beam machine comprises the use of a reciprocating rigid boring bar with a diamond scribe tip and a rigid holder for a coated deflector tube. The scribe tip is positioned within the bore of the tube and the boring bar is stroked in a direction parallel to the tube axis, while in engagement with the inner surface coating, to scribe very narrow lines on the thin film. These lines are formed along a major portion of the length of the tube and of a width less than 0.001 inch. After each scribing step, the tip or tube surface are separated and then the tube (or the boring bar and the scribe tip as the case may be) is incrementally rotated to form a number of separate isolated areas which form electrostatic plates. Dial position indicators with digital readouts locate the scribe tip to within a few ten thousandths of an inch and optical and resistance means are used to determine the integrity of each scribed line.

BRIEF DESCRIPTION OF THE DRAWINGS

FIG. 4 is a perspective view of the top of the deflector tube to illustrate the electrical connections to charge the electrostatic plates, FIG. 5 is a schematic illustration of the tool including a reciprocating boring bar and diamond scribe tip as it moved relative to the deflector.

FIG. 6 is a schematic illustration of a cross section of the deflector tube with the scribe tip relative to the inner wall of the tube, and FIG. 7 is an enlarged schematic illustration of the scribe tip engaging the deflector tube and a finally scribed line.

DETAILED DESCRIPTION

Figure 1:
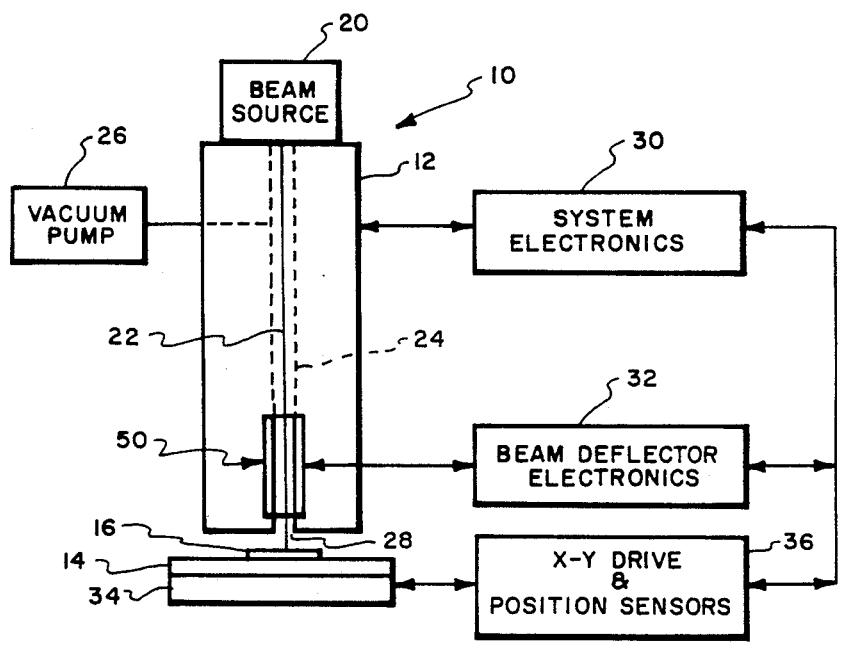
FIG. 1 is a schematic illustration of an electron beam lithography machine incorporating the electrostatic field deflector of this invention.

In the schematic illustration, FIG. 1, the electron beam lithography machine incorporating this invention is identified in its entirety as 10. The machine includes an electron beam column 12 and a workholding apparatus 14 upon which a workpiece 16 is loaded, processed and unloaded. The workpiece 16 is a semiconductor wafer or mask and is referred to as a substrate or simply a wafer.

As part of the beam column 12, there is provided an electron beam source 20, demagnification, projection and deflection optics which generate a finely focused beam 22. The optics may also include illumination and shaping objects when a shaped beam is used. A central tube 24 (a part of which is shown in phantom) is within the column 12, is traversed by the beam 22 and maintained at a high vacuum by a high vacuum pump 26 coupled to the column 12. The beam 22 passes through an aperture 28 in the column and impinges on the workpiece 16 for processing the latter. The complete lithography machine further includes a computer (controller) and associated binary electronics which controls the beam 22, controls a drive system for driving the workholding apparatus 14, stores pattern data and provides beam control signals; all identified by block diagrams 30 and 32.

In the simplified schematic illustration of FIG. 1, the workholding apparatus 14 includes a stage 34 which is driven in the x-y direction and in the z direction by conventional drives and its position sensed by a sensing system; all identified by block diagram 36.

Figures 2, 3:
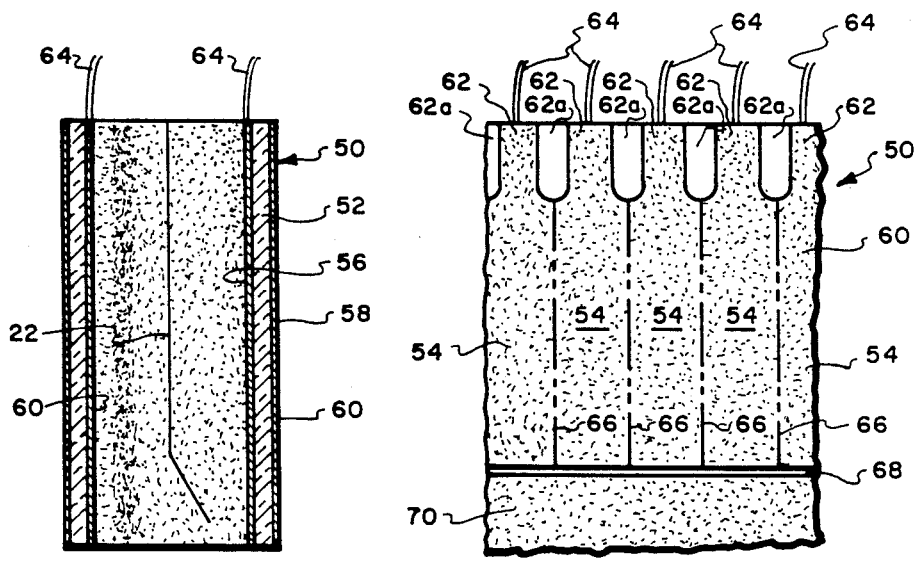
FIG. 2 is a schematic illustration of the electrostatic field deflector apart from the electron beam lithography machine simply to illustrate the deflection of the electron beam by the deflector of this invention.
FIG. 3 is a partial view of the inside of the deflector tube as if the tube were cut and flattened out to illustrate more clearly the electrostatic plates.

As further shown in FIG. 1, the central tube 24 will include the electrostatic field deflector 50 of this invention to deflect the beam electrostatically as demonstrated schematically in FIG. 2. This deflector 50 comprises a tube of glass 52, or other suitable insulating material, with a plurality of separated areas forming electrostatic plates 54, as shown in FIG. 3. These plates 54 are electrically isolated so as to function as electrostatic deflection plates to deflect beam 22 in response to the voltage applied to each of the plates in opposite pairs. As shown in FIGS. 3-6, the glass tube 52 is coated on both its inner sidewall 56 and outer sidewall 58 with a suitable thin metallic film 60, such as gold, (shown stippled) except for one end which is masked during coating to provide tabs 62. In the embodiment illustrated, the coating is gold approximately 10 to 20 microinches in thickness and, as illustrated in FIG. 4, there are eight such tabs connected to eight electrostatic plates. These tabs 62 are formed of the coated material and spaced circumferentially around the inner and outer walls 56 and 58 of the tube 50 so as to have areas 62a of insulating material therebetween on both the inner and outer walls of the tube. These tabs 62 are part of the coated material 60 on the inner sidewall 56 by having the coating extend over the end of the tube as shown at 62b. These tabs 62 are connected by conductors 64 to apply an electronic charge to each of the metal plates but in diametrically opposite pairs for the purpose of controlling the electron beam 22. The isolated plates 54, separated by lines 66 formed by this invention, extend lengthwise of a substantial portion of the tube and terminate at a ring 68, as shown in FIG. 3, which separates the plates from the ground plane 70. Ground plane 70 is of the same coated material 60. The ground plane 70 is connected to the coating 60 on the outside of the tube by having the coating extend over the end of the tube.

For the maximum operation of this electrostatic deflector, it is imperative that each of the plates be isolated from one another and from the ground plane 70 yet separated only enough that the electron beam is not exposed to the glass insulating material between each of the plates. This requires a precise fabrication of the longitudinal lines separating the isolated plates and how this is accomplished will now be described in detail.

As shown in FIG. 5, the electrostatic deflector tube 50 (also called a deflector tube) is mounted in a tool 80 which may be a lathe, a milling machine, or other suitable machine tool. The selected tool in this instance is a milling machine with a tube holder (divider head) 82 fastened in a mill bed 84, a collet 86 within the holder 82 to firmly hold the deflector tube 50, and a rigid boring bar 88 with a diamond scribe tip 90 held within a bar holder (mill arbor) 92. The boring bar 88 with the scribe tip 90 is moved into the bore of the deflector tube 50 and positioned by suitable instruments represented by block diagram 94 and the tube is rotated while the scribe tip 90 is in engagement with the coating to form the space 68 separating the ground plane 70 from the ends of the electrostatic plates 54. Aftr the space 68 is formed, the scribe tip 90 is positioned over the space 68 where the scribe tip 90 is then moved into engagement with the coating 60 on the inside of the tube and withdrawn axially, scribing a longitudinal line 66 to provide the spacing between the plates. The position of the scribe tip 90 is known within +/−0.0002 in., the position of the inner coated surface is known within +/−0.0002 in., and the scribe tip 90 is first advanced to the coating 60 and then advanced approximately 0.0015 in. more. As the scribe tip 90 is drawn, a line less than 0.001 in. wide is scribed. The longitudinal scribing step is repeated so as to form the isolated electrostatic plates 54. This, of course, assumes the selection of a tube whose concentricity is within +/−0.0005 in and which is straight along the length of the tube to within +/−0.0005 in.

More specifically, the procedure of manufacturing the isolated plates is as follows:

1. Mount the deflector tube 50 in the tube holder 82 with tabs 62 extending toward the scribe tip 90 and center the scribe tip 90 between any two tabs 62,
2. Insert the scribe tip 90 into the bore of the deflector tube 50 and cut a circumferential ring by rotating the tube 50 while holding the scribe tip 90 fixed to form space 68 separating the ends of the plates 54 from the ground plane 70 and check for completeness of the cut by measuring the resistance across the cut,
3. Firts cut one line 66 approximately centered between the tabs 62 to extend from the space 68 to the tabbed end and inspect this cut by optics. Cut a second line 66 of the same length 360/n degrees from the first vertical line to form n plates and before rotating the tube, perform a resistance test across both lines 66. If the inspection shows a defective cut, the cutting step is repeated. This can be done since the positions of the tube and the tip are known. Compensation can also be made for tip wear, and
4. Continue cutting one line 66 at a time, measuring the resistance across each cut line before moving on to the next position for cutting until the correct number of cuts have been made.

In connection with steps 3 and 4, the preferred scribing operation is to hold the tube 50 fixed while the scribe tip 90 is moved to cut the lines 66.

While steps 1, 2 and 3 describe the cutting of the lines 66 after the space 68 has been cut, the cutting of the space 68 first is not necessary. The lines 66 may be cut according to the steps 2, 3 and 4 and then the step of cutting space 68 may be performed. However, all integrity tests such as performed in each of the steps 2, 3 and 4 could not be performed until all cuttings have been performed.

While the above is shown as a vertical tool with vertical movements as in a milling machine, it is to be understood that the operation may also be performed horizontally as in a lathe. Generally speaking, however, in a lathe-like setup the scribe tip 90 is most toward the surface of the tube 50 and in a mill-like setup the tube 50 is moved toward the tip 90.

What is claimed is:

1. A method of forming an electrostatic deflector for use in controlling an electron beam in an electron beam machine comprising the steps of:
    fixing a metallized coated tube which is to form the deflector in a rigid holder,
    inserting a scribe tip directly mounted on a rigid bar longitudinally of the bore of the tube and while engaging the tube surface and using the rigidity of the rigid bar withdrawing the tip thereby scribing a thin longitudinal line through the coating,
    repeating the scribing step to form a plurality of separated coated areas within the tube.

2. The method as claimed in claim 1 wherein the scribing steps are performed after a circumferential line has been formed on the inside surface of the coated tube near one end of the tube to electrically separate the areas from the remainder of the coated tube and from each other.

3. The method as claimed in claim 2 wherein the longitudinal scribing steps being at the circumferential line.

4. The method as claimed in claim 3 wherein tabs are formed on the outside of the tube on the other end of the tube and connected to the areas so that the areas can be connected to suitable conductors.

5. The method as claimed in claim 1 wherein the longitudinal scribing steps are performed before a circumferential line has been formed on the inside surface of the coated tube.

6. The method as claimed in claim 5 wherein a circumferential line is formed on the inside surface of the coated tube near one end of the tube and contacting the ends of the longitudinal lines to electriccally separate the areas of the remainder of the coated tube and from each other.

7. The method as claimed in claim 6 wherein tabs are formed on the outside of the tube at the other end of the tube and connected to the areas so that the areas can be connected to suitable conductors.

8. A method of forming an electrostatic deflector for an electron beam machine comprising the steps of:
    coating a glass tube of a pre-selected length with a metal film except at one end of the tube where separate tabs are formed with alternate glass areas therebetween but which are connected to the coating on the inside of the tube,
    fixing the coated tube in a rigid holder,
    inserting a scribe tip directly mounted on a rigid bar within the bore of the tube and while engaging the coating cutting a circumferential line near the end of the tube opposite from the tabs to separate one part of the coating from the coating on the remainder of the tube and withdrawing the scribe tip from the tube surface,
    positioning the scribe tip over the circumferential line and into engagement with the tube and withdrawing the scribe tip longitudinally thereby scribing a thin line through the coating using the rigidity of the bar to continually urge the scribe tip into engagement with the tube,
    repeating the engagement and scribing step to form a plurality of areas which are electrically isolated from one another,
    said longitudinal lines being located between the tabs so that the tabs are electrically connected to each of the areas.

9. A method of forming an electrostatic deflector for an electron beam machine comprising the steps of:
    coating a glass tube of a preselected length with a metal film except at one end of the tube where separate tabs are formed with alternate glass areas therebetween but which are connected to the coating on the inside of the tube,
    fixing the coated tube in a rigid holder,
    inserting a scribe tip directly mounted on a rigid bar within the bore of the tube and while engaging the coating with drawing the scribe tip longitudinally thereby scribing a thin line through the coating using the rigidity of the bar to continually urge the scribe tip into engagement with the tube,
    repeating the engagment and scribing step to form a plurality of separated of areas,
    said longitudinal lines being located between the tabs so that the tabs are electrically connected to each of the areas, and
    positioning the scribe tip at the ends of the lines located away from the tabs and while engaging the coating cutting a circumferential line to separate one part of the coating from the coating on the remainder of the tube and thus separating each of said areas electrically from each other.

* * * * *